(12) United States Patent
Kang

(10) Patent No.: US 9,362,503 B2
(45) Date of Patent: Jun. 7, 2016

(54) DONOR MASK AND METHOD OF MANUFACTURING ORGANIC LIGHT-EMITTING DISPLAY APPARATUS

(71) Applicant: SAMSUNG DISPLAY CO., LTD., Yongin, Gyeonggi-Do (KR)

(72) Inventor: Tae-Wook Kang, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/536,036

(22) Filed: Nov. 7, 2014

(65) Prior Publication Data

US 2015/0380650 A1 Dec. 31, 2015

(30) Foreign Application Priority Data

Jun. 30, 2014 (KR) ........................ 10-2014-0081218

(51) Int. Cl.
*H01L 51/00* (2006.01)
*H01L 51/56* (2006.01)

(52) U.S. Cl.
CPC ............ *H01L 51/0013* (2013.01); *H01L 51/56* (2013.01)

(58) Field of Classification Search
None
See application file for complete search history.

(56) References Cited

U.S. PATENT DOCUMENTS

| 7,648,944 | B2 | 1/2010 | Matsuo et al. | |
|---|---|---|---|---|
| 8,093,612 | B2 | 1/2012 | Tanaka | |
| 8,129,004 | B2 | 3/2012 | Matsuo | |
| 8,153,201 | B2 * | 4/2012 | Aoyama | H01L 51/0013 427/407.1 |
| 2006/0292487 | A1 | 12/2006 | Kwon et al. | |
| 2008/0150419 | A1 * | 6/2008 | Kang | H01L 51/5237 313/504 |
| 2009/0075214 | A1 * | 3/2009 | Hirakata | H01L 51/0013 430/319 |
| 2015/0001495 | A1 * | 1/2015 | Choung | H01L 51/0013 257/40 |

FOREIGN PATENT DOCUMENTS

| JP | 2001-143866 A | 5/2001 |
|---|---|---|
| JP | 2006-309994 A | 11/2006 |
| JP | 10-5291607 B2 | 6/2013 |
| JP | 5294607 B2 | 6/2013 |
| KR | 2006-0135316 A | 12/2006 |
| KR | 2008-0047777 A | 5/2008 |
| WO | WO 2011/032938 A | 3/2011 |

* cited by examiner

*Primary Examiner* — Charles Garber
*Assistant Examiner* — Steven Christopher
(74) *Attorney, Agent, or Firm* — Lee & Morse, P.C.

(57) ABSTRACT

A method of manufacturing an organic light-emitting display apparatus including preparing a mother substrate that includes a plurality of display areas; forming a plurality of pixel electrodes on each of the display areas of the mother substrate; preparing a donor mask that includes a base substrate having a plurality of display transferring areas corresponding to the plurality of display areas, the base substrate including a groove between the display transferring areas, a light-to-heat conversion layer on the base substrate, and a reflective layer between the base substrate and the light-to-heat conversion layer and being patterned to include through holes in each of the display transferring areas; depositing a transferring layer on the light-to-heat conversion layer of the donor mask; aligning the mother substrate and the donor mask; and transferring portions of the transferring layer that overlie the through holes onto the pixel electrodes on the mother substrate.

9 Claims, 7 Drawing Sheets

DONOR MASK AND METHOD OF MANUFACTURING ORGANIC LIGHT-EMITTING DISPLAY APPARATUS

CROSS-REFERENCE TO RELATED APPLICATION

Korean Patent Application No. 10-2014-0081218, filed on Jun. 30, 2014, in the Korean Intellectual Property Office, and entitled: "Donor Mask and Method of Manufacturing Organic Light-Emitting Display Apparatus," is incorporated by reference herein in its entirety.

BACKGROUND

1. Field

Embodiments relate to a donor mask and a method of manufacturing an organic light-emitting display apparatus.

2. Description of the Related Art

An organic light-emitting display apparatus is a display apparatus including an organic light-emitting device (OLED) in a display area. The OLED includes a pixel electrode and an opposite electrode that face each other, and an intermediate layer between the pixel and opposite electrodes and including an emissive layer. When the organic light-emitting display apparatus is manufactured, various methods may be used to form the emissive layer. Examples of the methods may include a deposition method, an inkjet printing method, and the like.

SUMMARY

Embodiments are directed to a donor mask and a method of manufacturing an organic light-emitting display apparatus.

The embodiments may be realized by providing a method of manufacturing an organic light-emitting display apparatus, the method including preparing a mother substrate such that the mother substrate includes a plurality of display areas; forming a plurality of pixel electrodes on each of the plurality of display areas of the mother substrate; preparing a donor mask such that the donor mask includes a base substrate having a plurality of display transferring areas corresponding to the plurality of display areas of the mother substrate, the base substrate including a groove between the plurality of display transferring areas, a light-to-heat conversion layer on the base substrate, and a reflective layer between the base substrate and the light-to-heat conversion layer, the reflective layer being patterned to include a plurality of through holes in each of the plurality of display transferring areas; depositing a transferring layer on the light-to-heat conversion layer of the donor mask; aligning the mother substrate and the donor mask; and transferring portions of the transferring layer of the donor mask that overlie the plurality of through holes onto the plurality of pixel electrodes on the mother substrate.

The transferring layer may include an emissive layer.

Therein transferring the portions of the transferring layer may include irradiating flash lamp light or a laser beam onto the base substrate of the donor mask, and evaporating, vaporizing, or sublimating at least a portion of the irradiated transferring layer.

The light-to-heat conversion layer of the donor mask may be only on the plurality of display transferring areas of the base substrate.

The light-to-heat conversion layer of the donor mask may be on the plurality of display transferring areas of the base substrate and on the groove, and an upper surface of a portion of the light-to-heat conversion layer on the groove may be closer to the base substrate than upper surfaces of portions of the light-to-heat conversion layer on the plurality of display transferring areas.

The reflective layer of the donor mask may also be on the groove of the base substrate.

The donor mask may further include a heat insulating layer between the reflective layer and the light-to-heat conversion layer.

The heat insulating layer of the donor mask may only be on the plurality of display transferring areas of the base substrate.

The heat insulating layer of the donor mask may be on the plurality of display transferring areas of the base substrate and on the groove, and an upper surface of a portion of the heat insulating layer on the groove may be closer to the base substrate than upper surfaces of portions of the heat insulating layer on the plurality of display transferring areas.

BRIEF DESCRIPTION OF THE DRAWINGS

Features will be apparent to those of ordinary skill in the art by describing in detail exemplary embodiments with reference to the attached drawings in which.

DETAILED DESCRIPTION

Figure 1:
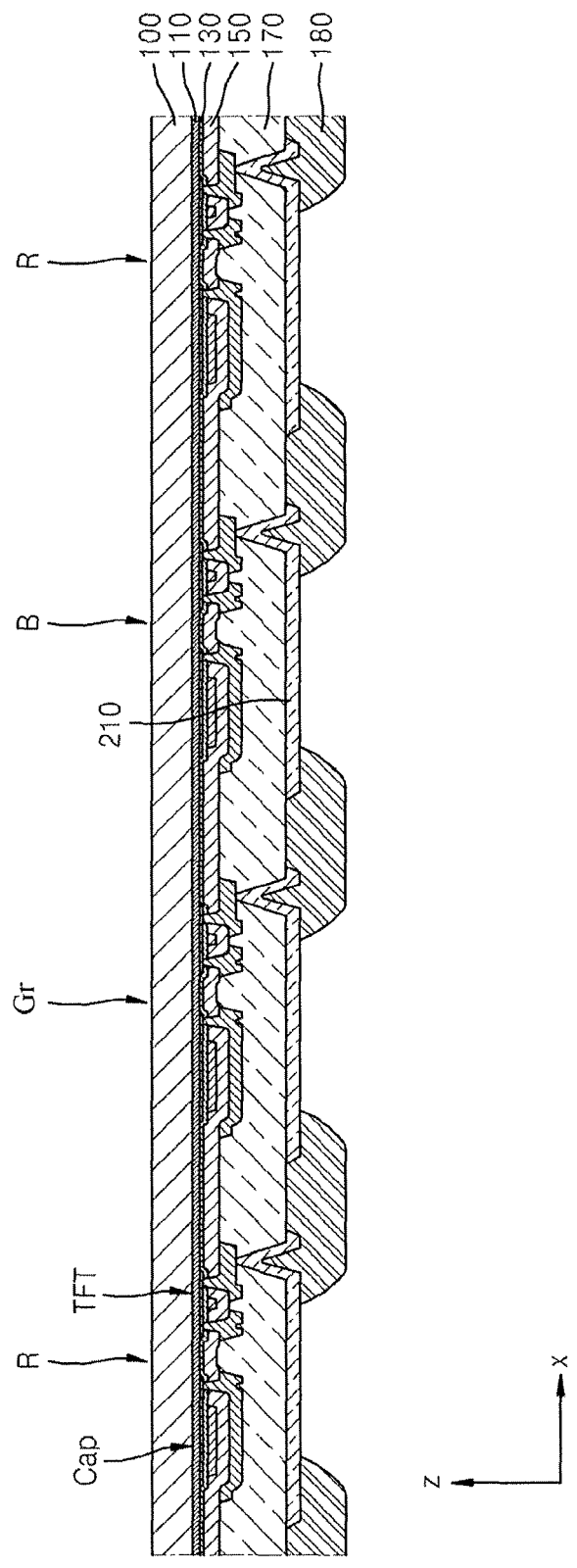
FIGS. 1 through 4 illustrate schematic cross-sectional views of stages in a method of manufacturing an organic light-emitting display apparatus according to embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that when a component, such as a layer, a film, a region, or a plate, is referred to as being "on" another component, the component can be directly on the other component or intervening components may be present thereon.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIGS. 1 through 4 illustrate schematic cross-sectional views of stages in a method of manufacturing an organic light-emitting display apparatus, according to embodiments.

As shown in FIG. 1, a back plane may be prepared. The back plane my include a substrate 100, pixel electrodes 210 on the substrate 100, and a pixel-defining layer 180 that exposes at least portions of the pixel electrodes 210, including centers of the pixel electrodes 210. For example, the pixel-defining layer 180 may protrude more than the pixel electrodes 210, with respect to the substrate 100. For example, the pixel-defining layer 180 may protrude further from the substrate 100 than the pixel electrodes 210 protrude from the substrate 100.

The pixel electrodes 210 may be transparent (or translucent) electrodes or reflective electrodes. When the pixel electrodes 210 are transparent (or translucent) electrodes, the pixel electrodes 210 may be formed of, e.g., indium tin oxide (ITO), indium zinc oxide (IZO), zinc oxide (ZnO), indium oxide ($In_2O_3$), indium gallium oxide (IGO), or aluminum zinc oxide (AZO). When the pixel electrodes 210 are reflective electrodes, the pixel electrodes 210 may include a reflective film formed of, e.g., silver (Ag), magnesium (Mg), aluminum (Al), platinum (Pt), palladium (Pd), gold (Au), nickel (Ni), neodymium (Nd), iridium (Ir), chromium (Cr), or combinations thereof, and a film formed of ITO, IZO, ZnO or $In_2O_3$. In an implementation, structures and materials of the pixel electrodes 210 are not limited thereto and may differ.

The pixel-defining layer 180 may define pixels by openings corresponding to sub-pixels, respectively, e.g., openings that expose centers of the pixel electrodes 210 or all of the pixel electrodes 210. In an implementation, the pixel-defining layer 180 may prevent arcs or other defects from occurring at ends of the pixel electrodes 210 by increasing a distance between the ends of the pixel electrodes 210 and opposite electrodes (not shown) on the pixel electrodes 210.

In an implementation, the back plane may further include various components. For example, a thin film transistor (TFT) or a capacitor may be formed on the substrate 100, as shown in FIG. 1. In an implementation, the back plane may include a buffer layer 110 (that helps prevent impurities from penetrating into a semiconductor layer of the TFT), a gate insulating layer 130 (that insulates the semiconductor layer of the TFT from a gate electrode), an interlayer insulating layer 150 (that insulates source/drain electrodes of the TFT from the gate electrode), a planarization layer 170 (that covers the TFT and has a flat upper surface), or the like.

Figure 2:
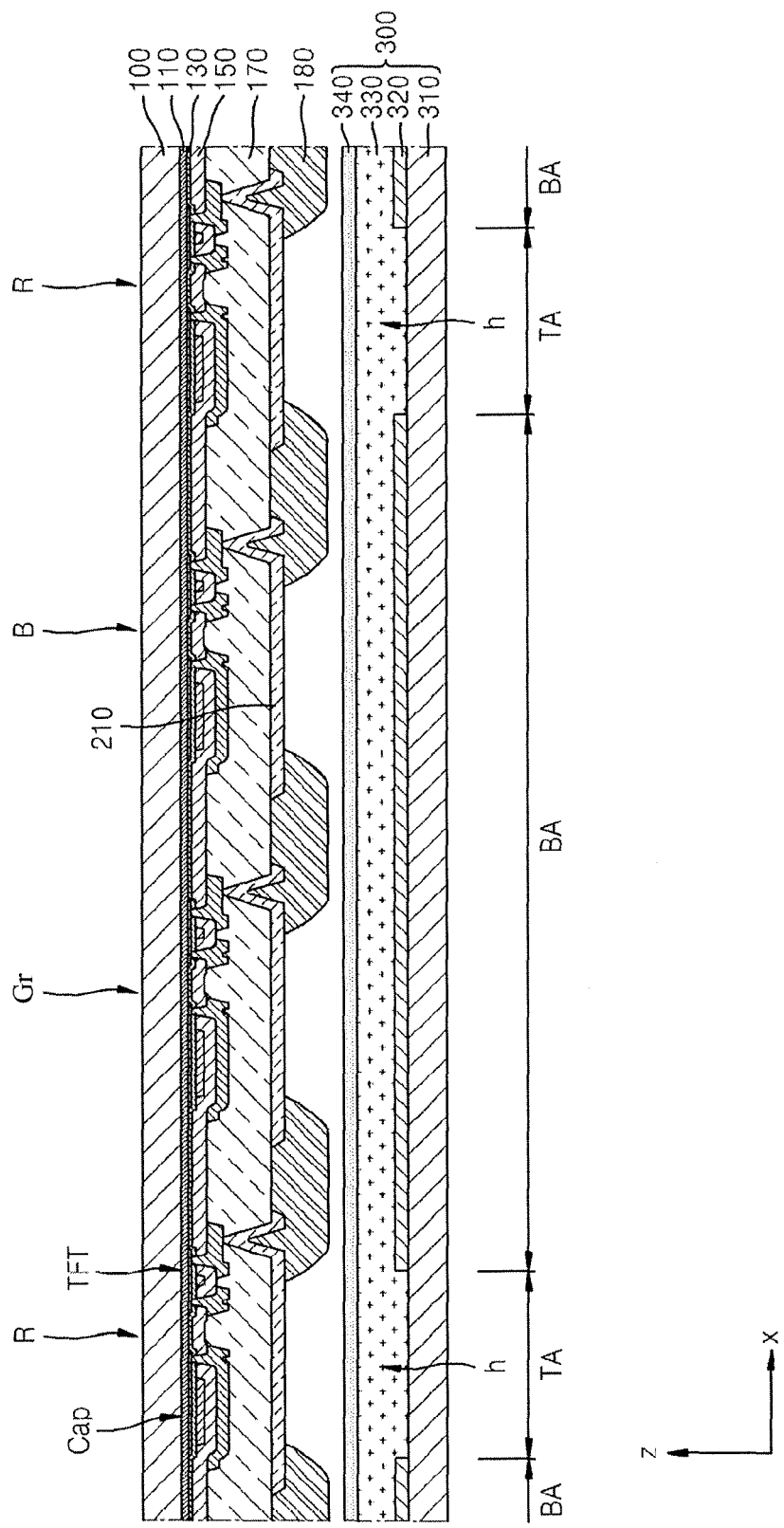

After preparing the back plane, a donor mask 300 may be prepared and then arranged to face the pixel electrodes 210 and the pixel-defining layer 180 of the back plane, as shown in FIG. 2. For example, as shown in FIG. 2, the pixel electrodes 210 and the pixel-defining layer 180 of the back plane may be arranged to face downward (in a negative Z direction of FIG. 2), and the donor mask 300 may be arranged under the back plane. Layers, e.g., a hole injection layer, a hole transport layer, or the like, may be formed on the pixel electrodes 210 or on an entire surface of the substrate 100 before the back plane and the donor mask 300 are arranged. In FIG. 2, there is a great gap between the back plane and the donor mask 300. However, this is for convenience of description and illustration, the donor mask 300 may be adhered, e.g., directly adhered, to the back plane.

The donor mask 300 may include a base substrate 310, a reflective layer 320, a light-to-heat conversion layer 330, and a transferring layer 340. In an implementation, the transferring layer 340 may not be a component of the donor mask 300 and may be, e.g., separately, formed on the donor mask 300. For example, it may be understood that the donor mask 300 is prepared to manufacture the organic light-emitting display apparatus, and then the transferring layer 340 may be disposed on the donor mask 300.

The base substrate 310 may form an overall exterior of the donor mask 300, and may be formed of, e.g., glass, in order to transmit light to the light-to-heat conversion layer 330. In an implementation, the base substrate 310 may be formed of, e.g., a polyester (such as polyethylene terephthalate (PET)), polyacryl, polyepoxy, polyethylene, and/or polystyrene.

The light-to-heat conversion layer 330 may be a layer that absorbs flash lamp light or a laser beam when the flash lamp light or laser beam is irradiated and converts a certain amount of energy of the absorbed flash lamp light or laser beam into heat. The light-to-heat conversion layer 330 may be, e.g., a metal layer such as Al or Ag that is capable of absorbing infrared-visible rays, an oxide/sulfide layer having the aforementioned metal, a polymer organic layer including carbon black, graphite, or the like.

The reflective layer 320 may be disposed between the base substrate 310 and the light-to-heat conversion layer 330. The reflective layer 320 may include through holes h therein. For example, the reflective layer 320 may have transmission areas TA (corresponding to the through holes h, e.g., where the through holes h are located) and block areas BA (corresponding to areas of the reflective layer 320 other than the through holes h).

The through holes h of the reflective layer 320 may be formed by using a mask on the base substrate 310, or may be formed by forming the through holes h after forming layers having a uniform thickness and then removing parts of the layers having the uniform thickness. The reflective layer 320 may be formed by using, e.g., titanium (Ti), Al, copper (Cu), molybdenum (Mo), alloys thereof, chromium nitride (CrN), TiAlCu, or the like. In an implementation, the reflective layer 320 may be formed of, e.g., titanium oxide (TiOx), silicon dioxide (SiOx), silicon carbon nitride (SiCn), or the like.

The transferring layer 340 may be a layer that may be vaporized, evaporated, or sublimated by heat generated in the light-to-heat conversion layer 330. The transferring layer 340 may include, e.g., an emissive material. In an implementation, the transferring layer 340 may include, e.g., a layer including a hole injection material, a layer including a hole transport material, a layer including an electron transport material, or a layer including an electron injection material.

As shown in FIG. 2, when the back plane and the donor mask 300 are arranged, the back plane and the donor mask 300 may be accurately aligned. For example, the back plane and the donor mask 300 may be aligned such that the transmission areas TA of the reflective layer 320 of the donor mask 300 correspond to or overlie predetermined areas of the back plane. As shown in FIG. 2, the transferring layer 340 of the donor mask 300 may include an emissive material that is capable of emitting red light, and thus, it is shown that the back plane and the donor mask 300 are aligned to make the through holes h of the reflective layer 320 included in the donor mask 300 correspond to or overlie the pixel electrodes 210 of red sub-pixels R.

Figure 3:
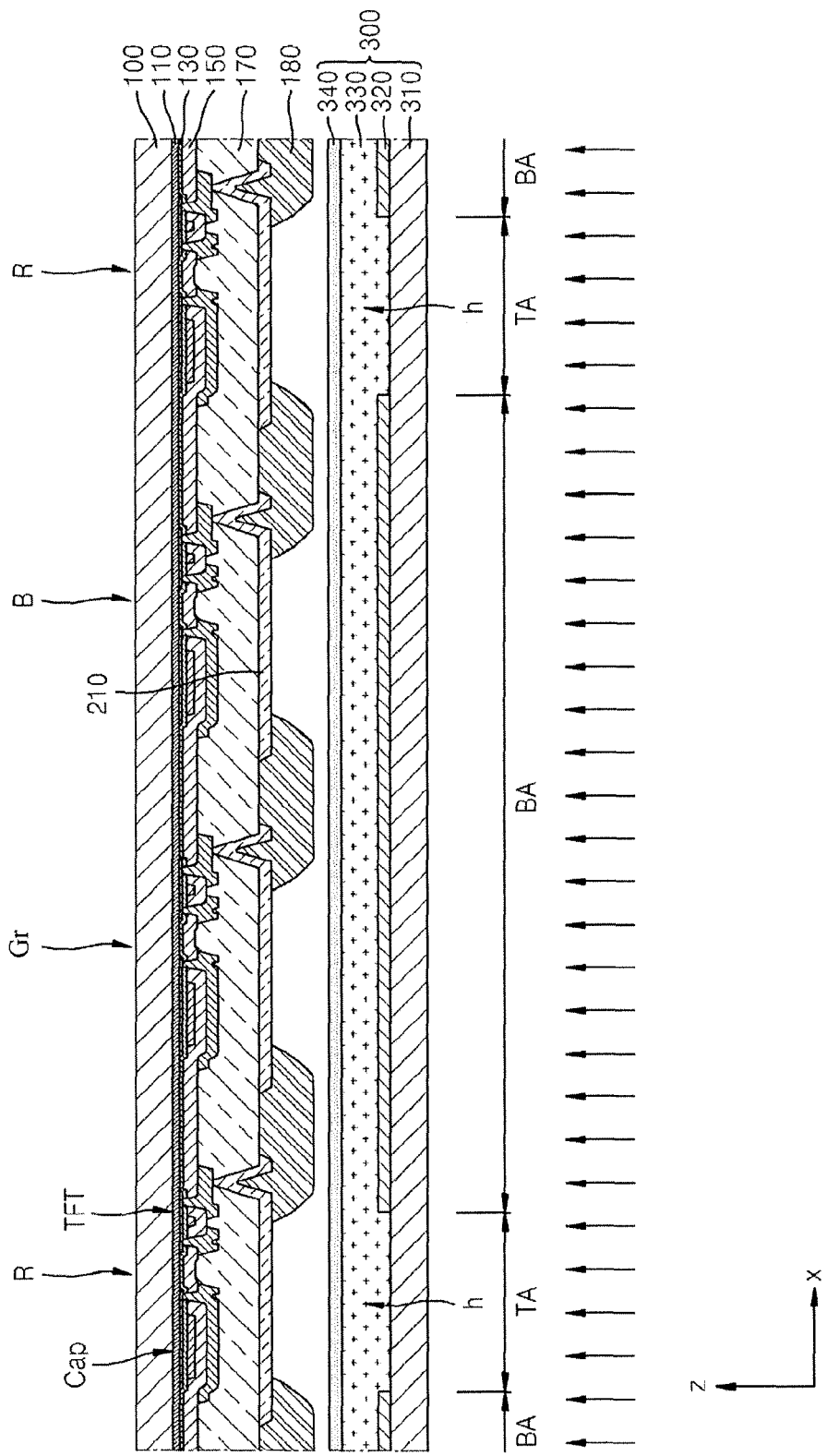
Figure 4:
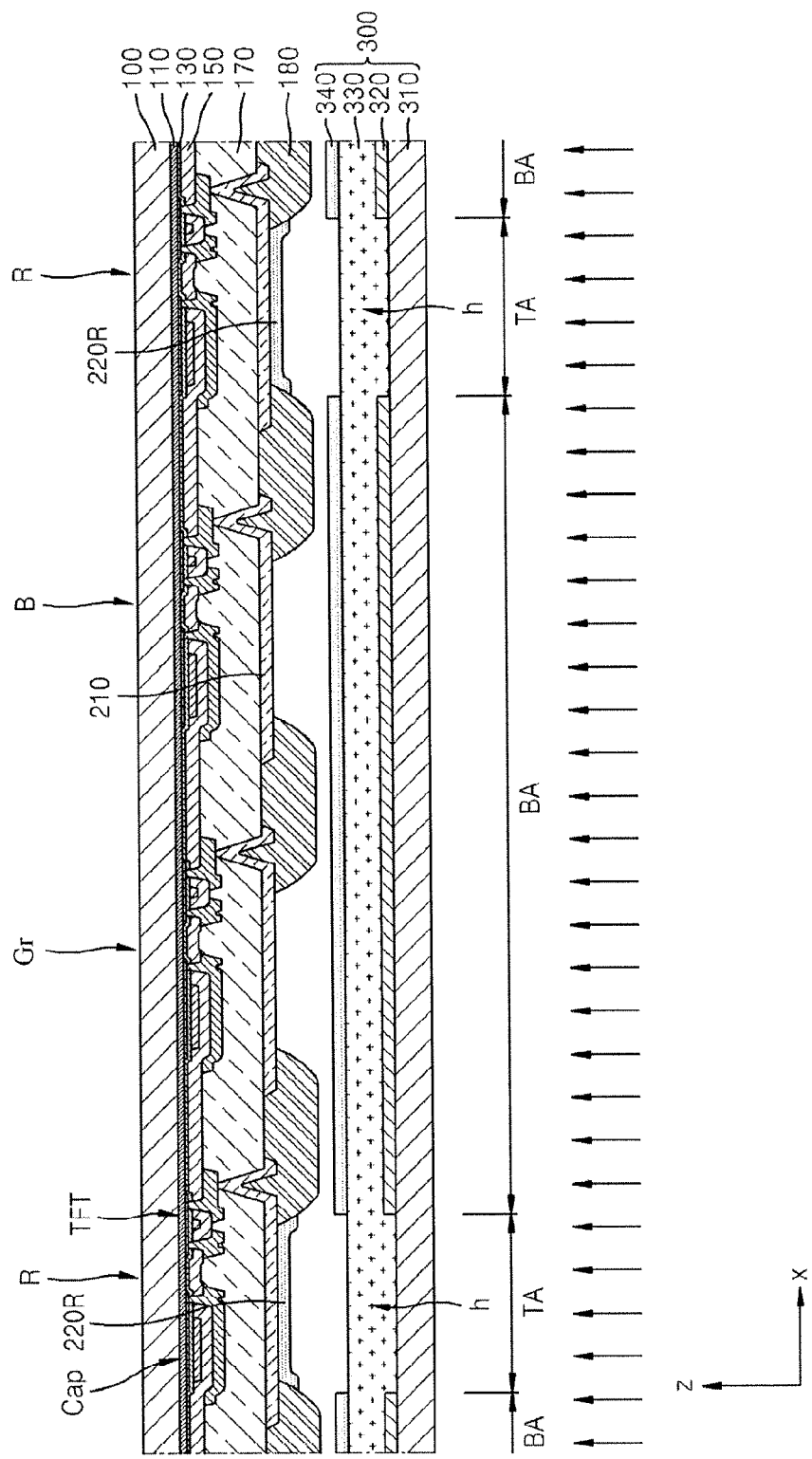

As shown in FIG. 3, a portion of the transferring layer 340 of the donor mask 300 may be transferred to the back plane by irradiating lamp light or a laser beam onto the donor mask 300 by using, e.g., a flash lamp or a laser beam oscillator. For example, although the lamp light or laser beam may be irradiated onto an entire surface of the donor mask 300 by using a flash lamp or laser beam oscillator, the lamp light or laser beam may be mostly blocked or reflected back by the reflective layer 320, and may reach the light-to-heat conversion layer 330 only through the transmission areas TA corresponding to or at the through holes h in the reflective layer 320. Accordingly, only portions of the transferring layer 340 that correspond to or overlie the transmission areas TA may be evaporated, vaporized, or sublimated. Thus, as shown in FIG. 4, a red light emissive layer 220R may be formed on the pixel electrodes 210 of the red sub-pixel R.

As described with reference to FIG. 2, FIG. 3 shows that there may be a great gap between the donor mask 300 and the back plane. However, this is for convenience of description and illustration, and the donor mask 300 may be adhered to, e.g., directly adhered to, the back plane. If the donor mask 300 were to be spaced apart from the back plane, although portions of the transferring layer 340 of the donor mask 300 that correspond to or overlie the transmission areas TA are evaporated, vaporized, or sublimated, materials generated after the portions corresponding to the TAs are evaporated, vaporized, or sublimated move onto the pixel electrodes 210 of the red sub-pixel R, some of the materials could undesirably move onto the pixel electrodes 210 of neighboring sub-pixels.

After the red light emissive layer 220R is formed, the donor mask 300 may be replaced, and a green light emissive layer or a blue light emissive layer may be formed on the pixel electrodes 210 of a green sub-pixel Gr or a blue sub-pixel B. In an implementation, an electron injection layer, an electron transport layer, or the like may be formed, and opposite electrodes corresponding to the red sub-pixels R, green sub-pixel Gr, and blue sub-pixel B may be formed. Accordingly, the organic light-emitting display apparatus may be manufactured.

Figure 5:
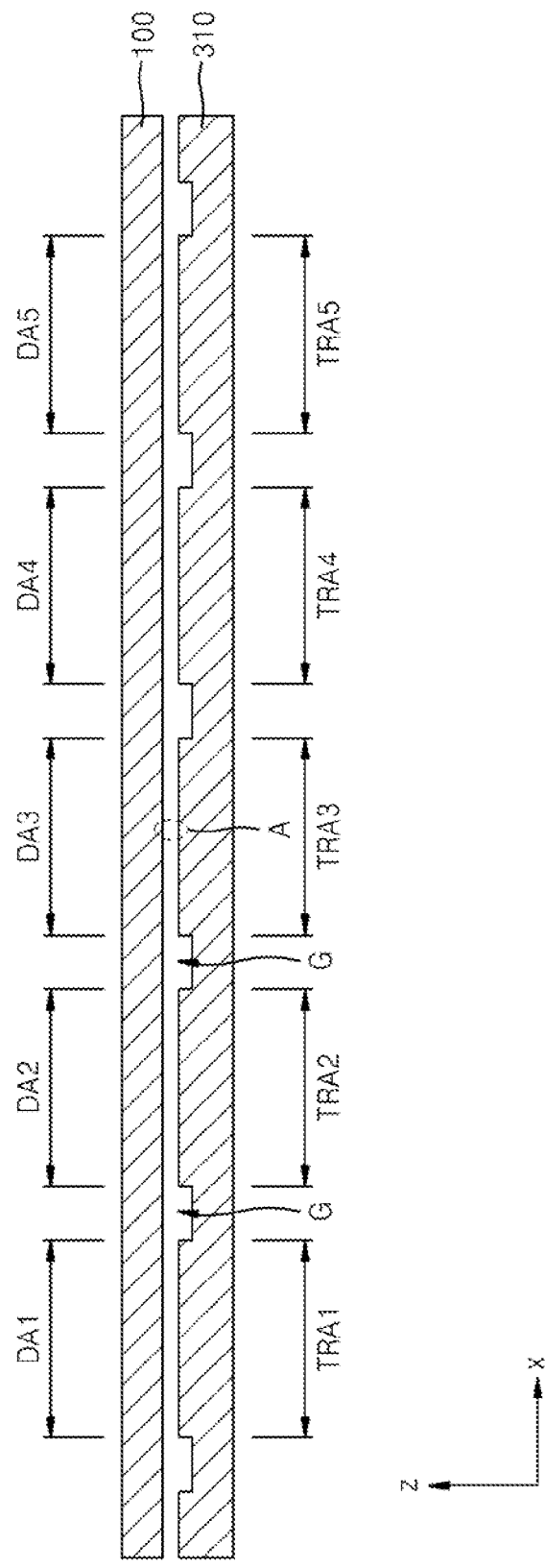
FIG. 5 illustrates a schematic cross-sectional view showing a relationship between a portion of a donor mask and a substrate, according to an embodiment.

According to the above-described manufacturing method, a plurality of organic light-emitting display apparatuses may be simultaneously manufactured. As shown in FIG. 5, the substrate 100 may be a mother substrate having display areas DA1 through DA5 and hereafter referred to as so. For example, each of the display areas DA1 through DA5 corresponds to organic light-emitting apparatuses, respectively, and it may be understood that FIGS. 1 through 4 partially show some portions of the mother substrate 100. For example, it may be understood that FIG. 2 may correspond to a portion of the display area DA3 of the mother substrate 100, which is indicated as A in FIG. 5. For example, the preparation of the back plane may include preparing the mother substrate 100 having the display areas DA1 through DA5 and forming the pixel electrodes 210 on the display areas DA1 through DA5 of the mother substrate 100, respectively.

In this case, the base substrate 310 of the donor mask 300 may have transferring areas TRA1 through TRA5 for display, e.g., display transferring areas TRA1 through TRA5, that correspond to the display areas DA1 through DA5 of the mother substrate 100. The base substrate 310 may have a groove G formed between the display transferring areas TRA1 through TRA5. A light-to-heat conversion layer 330 (refer to FIG. 2 and not shown in FIG. 5) of the donor mask 300 may be only disposed on the display transferring areas TRA1 through TRA5 of the base substrate 310. The reflective layer 320 may have a shape that is patterned to have the through holes h corresponding to each of the display transferring areas TRA1 through TRA5.

The organic light-emitting display apparatus may be manufactured by aligning the donor mask 300 and the mother substrate 100 and then transferring portions of the transferring layer 340 to the pixel electrodes 210 on the mother substrate 100.

When organic light-emitting display apparatuses are simultaneously manufactured, the organic light-emitting display apparatuses may have a uniform quality. When portions of the transferring layer 340 are transferred onto the pixel electrodes 210 on the mother substrate 100, portions of the transferring layer 340 may be uniformly transferred, which means that respective distances between the display areas DA1 through DA5 of the mother substrate 100 and the display transferring areas TRA1 through TRA5 of the donor mask 300 should be constant.

In the method of manufacturing the organic light-emitting display apparatus according to the present embodiment, the base substrate 310 of the donor mask 300 may have the groove G between the display transferring areas TRA1 through TRA5. Accordingly, the transferring areas TRA1 through TRA5 of the base substrate 310 of the donor mask 300 may protrude more than other portions of the base substrate 310 in a direction toward the mother substrate 100. Therefore, portions of the base substrate 310 of the donor mask 300 that correspond to the display transferring areas TRA1 through TRA5 may adhere to the display areas DA1 through DA5 of the mother substrate 100 more uniformly and closely. As a result, the organic light-emitting display apparatuses having a uniform quality may be simultaneously manufactured.

The base substrate 310 of the donor mask 300 or the mother substrate 100 of the back pane may be slightly flexible, but may basically be rigid. Thus, if an upper surface of the base substrate 310 of the donor mask 300 were to be flat, e.g., if the base substrate 310 were to not have the groove G between the display transferring areas TRA1 through TRA5, and if the thicknesses of the base substrate 310, the mother substrate 100, other layers of the base substrate 310, or other layers on the mother substrate 100 were to be slightly non-uniform, such non-uniformity could cumulatively affect the quality of manufactured organic light-emitting display apparatus.

For example, if the base substrate 310 of the donor mask 300 did not have the groove G, and if upper surfaces of first portions of the base substrate 310 were to protrude more than second portions thereof, a distance between the donor mask 300 and the mother substrate 100 around the first portions of the base substrate 310 could be farther than a distance between the donor mask 300 and the mother substrate 100 in the second portions of the base substrate 310. A distance between the donor mask 300 and the mother substrate 100 in the third portions of the base substrate 310 (far from the first portions of the base substrate 310) could be substantially the same as the distance between the donor mask 300 and the mother substrate 100 in the second portions. If the first portions were to correspond to areas of the mother substrate 100 between the display areas DA1 through DA5, deposition may not be uniformly performed on some of the display areas DA1 through DA5 of the mother substrate 100, which are located nearby the first portions of the base substrate 310.

In the case of the method of manufacturing the organic light-emitting display apparatus according to the present embodiment, the base substrate 310 of the donor mask 300 may have the groove G that are similar to the groove G described above. Therefore, non-uniform characteristics may be effectively prevented in advance.

In an implementation, unlike the descriptions with reference to FIGS. 2 through 4, the donor mask 300 may further include a heat insulating layer (not shown) between the reflective layer 320 and the light-to-heat conversion layer 330. The heat insulating layer may help prevent heat generated by the light-to-heat conversion layer 330 from being transmitted by the reflective layer 320 and undesirably affecting a transferring layer 340 of a barrier area BA of the reflective layer 320. The heat insulating layer may be formed of a material having low thermal conductivity. For example, by providing the heat insulating layer only on the display transferring areas TRA1 through TRA5 of the base substrate 310, portions of an upper surface of the donor mask 300 that correspond to the display transferring areas TRA1 through TRA5 of the base substrate 310 may protrude more or further than portion of the upper surface of the donor mask 300 that corresponds to the groove G of the base substrate 310. For example, the groove G may be formed by the lack of a heat insulating layer.

In an implementation, the donor mask 300 may include the heat insulating layer, and the heat insulating layer may be disposed on the display transferring areas TRA1 through TRA5 and in or on the groove G of the base substrate 310. For example, upper surfaces of portions of the heat insulating layer, which correspond to the groove G, may be lower than the upper surfaces of the portions of the heat insulating layer, which correspond to the display transferring areas TRA1 through TRA5. Thus, the organic light-emitting display apparatus having a uniform quality may be simultaneously manufactured.

By providing the light-to-heat conversion layer 330 only on the transferring areas TRA1 through TRA5 of the base substrate 310, portions of the upper surface of the donor mask 300 that correspond to the display transferring areas TRA1 through TRA5 of the base substrate 310 may protrude more or further than portion of the upper surface of the donor mask 300 that corresponds to the groove G of the base substrate 310. For example, the light-to-heat conversion layer 330 may only be provided on the display transferring areas TRA1 through TRA5 of the base substrate 310, and not on the groove G of the base substrate 310.

In an implementation, the light-to-heat conversion layer 330 may be disposed on the display transferring areas TRA1 through TRA5 and the groove G of the base substrate 310. For example, the upper surface of the portion of the light-to-heat conversion layer 330, which corresponds to the groove G, may be lower than the upper surfaces of portions of the light-to-heat conversion layer 330, which correspond to the display transferring areas TRA1 through TRA5. Thus, as described above, the organic light-emitting display apparatuses having a uniform quality may be simultaneously manufactured.

In the case of the reflective layer 320, the reflective layer 320 may not be disposed on the groove G of the base substrate 310. For example, a portion of the transferring layer 340 that corresponds to the groove G of the base substrate 310 may be transferred onto the mother substrate 100. A portion of the mother substrate 100, which corresponds to the groove G of the base substrate 310, may be finally cut. Thus, the organic light-emitting display apparatuses may be manufactured. The portion of the mother substrate 100, which corresponds to the groove G of the base substrate 310, may be included in non-emissive areas of each of the organic light-emitting display apparatuses or may be removed, and the reflective layer 320 may not be disposed on the groove G of the base substrate 310. However, materials used for the transferring layer 340 may be wasted. Thus, disposing the reflective layer 320 on the groove G of the base substrate 310 may be considered.

Figure 6:
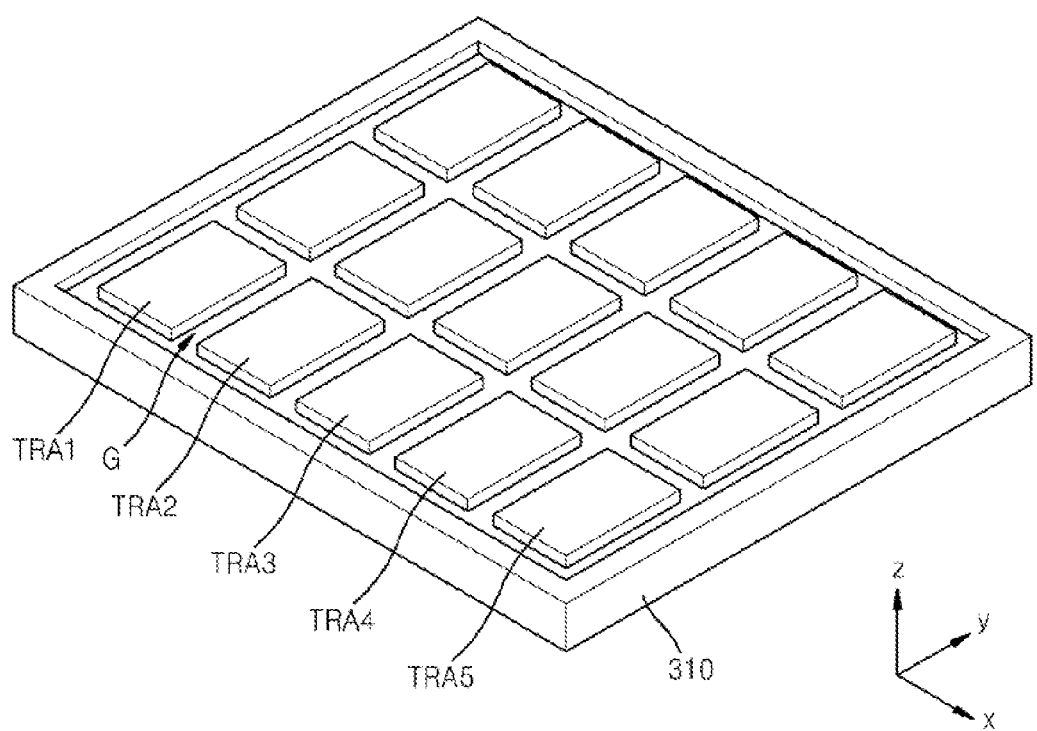
FIG. 6 illustrates a schematic perspective view of a portion of the donor mask of FIG. 5.
Figure 7:
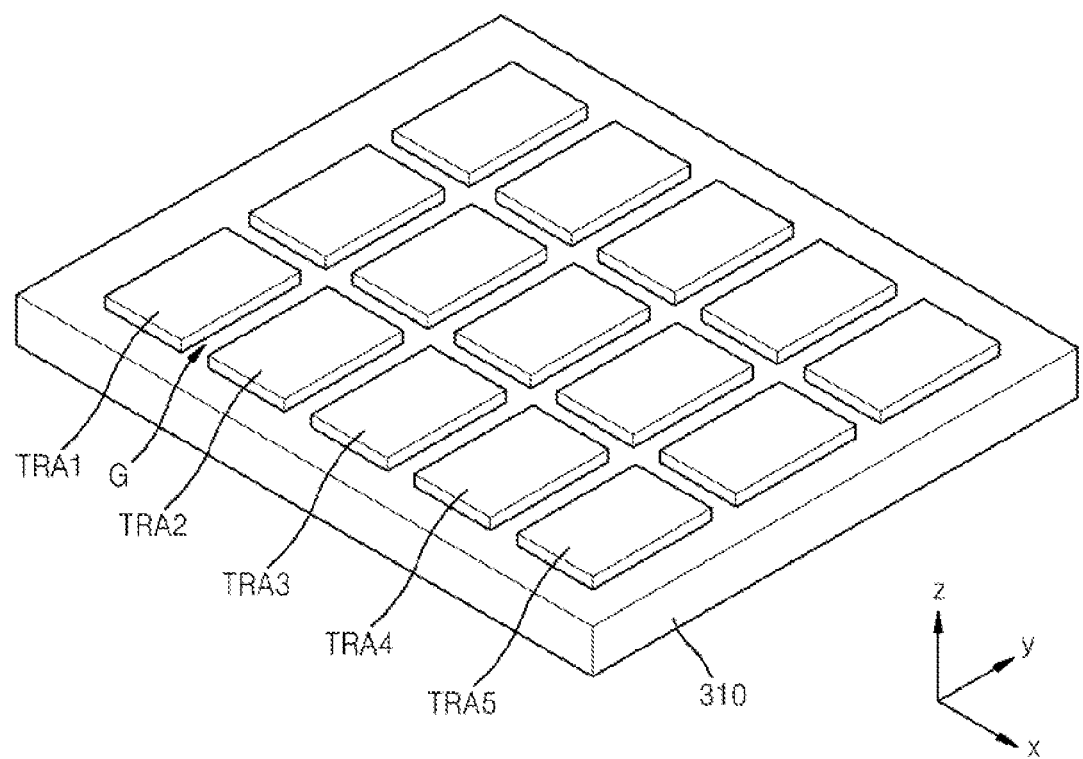
FIG. 7 illustrates a schematic perspective view of a portion of the donor mask, according to another embodiment.

FIG. 6 illustrates a schematic perspective view of a portion of the donor mask 300 of FIG. 5. As shown in FIG. 6, the base substrate 310 of the donor mask 300 may have outer protrusions, which may protrude toward the mother substrate 100, around outermost portions of the base substrate 310, similarly as the display transferring areas TRA1 through TRA5. For example, the outer protrusions may protrude a same or similar distance from the base substrate 310 as the display transferring areas TRA1 through TRA5. As shown in FIG. 7, which illustrates a schematic perspective view of a portion of the donor mask 300, according to another embodiment, the base substrate 310 of the donor mask 300 may have a shape in which other portions (other than the display transferring areas TRA1 through TRA5) are removed. For example, due to such a shape, respective distances between the display transferring areas TRA1 through TRA5 of the base substrate 310 and the display areas DA1 through DA5 of the mother substrate 100 may be uniform and minimum.

The embodiments may also provide a donor mask 300. The donor mask 300 according to the an embodiment may include the base substrate 310, the reflective layer 320, and the light-to-heat conversion layer 330, as shown in FIGS. 2 through 5. The transferring layer 340 may be formed on the light-to-heat conversion layer 330 by, e.g., deposition or the like.

The base substrate 310 may form an overall exterior of the donor mask 300 and may be formed of glass in order to transmit light to the light-to-heat conversion layer 330. In an implementation, the base substrate 310 may be formed of polyester such as PET, polyacryl, polyepoxy, polyethylene, and/or polystyrene.

As described above, the base substrate 310 may include the display transferring areas TRA1 through TRA5 and may have a shape in which the groove G are formed between the display transferring areas TRA1 through TRA5. It may be understood that the display transferring areas TRA1 through TRA5 of the base substrate 310 correspond to the display areas of display apparatuses to be manufactured.

The light-to-heat conversion layer 330 may be a layer that absorbs, e.g., flash lamp light or a laser beam, during irradiation and converts at least some amounts of energy of the absorbed flash lamp light or laser beam into heat. The light-to-heat conversion layer 330 may be, e.g., a metal layer such as Al or Ag, an oxide/sulfide layer including metals, or a polymer organic layer including carbon black, graphite, or the like, which may absorb infrared-visible rays.

The reflective layer 320 may be patterned to have through holes h in each of the display transferring areas TRA1 through TRA5. For example, the reflective layer 320 may have the transmission areas TA (e.g., corresponding to the through holes h) and the barrier area BA. In an implementation, the reflective layer 320 may have a single-layer structure. In an implementation, the reflective layer 320 may have a multi-layer structure. For example, the reflective layer 320 may have a light barrier layer (not shown) corresponding to or in the barrier area BA. The light barrier layer may include metals that may effectively block light, materials used for a black matrix, or the like. The reflective layer 320 may have a different structure, e.g., a multilayer structure in which metal layers and inorganic layers are included, or a multilayer structure in which inorganic layers are included.

The donor mask 300 according to the present embodiment may be used in the method of manufacturing the organic light-emitting display apparatus described above. The donor mask 300 may help minimize defects when an organic light-emitting display apparatus is manufactured and may help to simultaneously manufacture organic light-emitting display apparatuses.

In an implementation, and different from the descriptions with reference to FIGS. 2 through 4, the donor mask 300 may further include the heat insulating layer (not shown) between the reflective layer 320 and the light-to-heat conversion layer 330. The heat insulating layer may help prevent heat generated by the light-to-heat conversion layer 330 from being transmitted through the reflective layer 320 or the like and undesirably affecting (e.g., unintentionally transferring or releasing) the transferring layer 340 on the barrier area BA of the reflective layer 320. The heat insulating layer may be formed of a material having low thermal conductivity. For example, by providing the heat insulating layer only on the display transferring areas TRA1 through TRA5 of the base substrate 310, the portions of the upper surface of the donor mask 300 that correspond to the display transferring areas TRA1 through TRA5 of the base substrate 310 may protrude relatively more or further than the portion of the upper surface of the donor mask 300 that corresponds to the groove G of the base substrate 310.

In an implementation, the donor mask 300 may include the heat insulating layer, and the heat insulating layer may be disposed on the display transferring areas TRA1 through TRA5 and on the groove G of the base substrate 310, unlike or different from the above description. For example, the upper surface of the portion of the heat insulating layer, which corresponds to the groove G, may be lower than the upper surfaces of the portions of the heat insulating layer, which correspond to the display transferring areas TRA1 through TRA5. Thus, the organic light-emitting display apparatus having a uniform quality may be simultaneously manufactured, as described above.

By providing the light-to-heat conversion layer 330 be only on the display transferring areas TRA1 through TRA5 of the base substrate 310, the portions of the upper surface of the donor mask 300 that correspond to the display transferring areas TRA1 through TRA5 of the base substrate 310 may protrude relatively more or further than the portion of the upper surface of the donor mask 300 that corresponds to the groove G of the base substrate 310.

In an implementation, and different the above description, the light-to-heat conversion layer 330 may be disposed on the display transferring areas TRA1 through TRA5 and on the groove G of the base substrate 310. For example, the upper surface of the portion of the light-to-heat conversion layer 330, which correspond to the groove G, may be lower than the upper surfaces of portions of the light-to-heat conversion layer 330, which correspond to the display transferring areas TRA1 through TRA5. Thus, as described above, organic light-emitting display apparatuses having a constant quality may be simultaneously manufactured.

In an implementation, the reflective layer 320 may not be disposed on the groove G of the base substrate 310. For example, the portion of the transferring layer 340, which corresponds to the groove G of the base substrate 310, may be transferred to the mother substrate 100. The portion of the mother substrate 100, which corresponds to the groove G of the base substrate 310, may be finally cut, and organic light-emitting display apparatuses are manufactured. The portion of the mother substrate 100, which corresponds to the groove G of the base substrate 310, may be included in non-emission areas or each of the organic light-emitting display apparatuses or cut and then removed, the reflective layer 320 may not be disposed on the groove G of the base substrate 310. However, in this case, materials used for the transferring layer 340 may be wasted, and it may be considered to dispose the reflective layer 320 on the groove G of the base substrate 310.

By way of summation and review, when organic light-emitting display apparatuses are manufactured by some methods of manufacturing an organic light-emitting display apparatus, an occurrence rate of defects may be great, or the quality of the organic light-emitting display apparatuses, which are simultaneously manufactured, may not be uniform.

The embodiments may provide a donor mask that helps manufacture organic light-emitting display apparatuses that have a reduced occurrence rate of defects and uniform quality.

As described above, according to the an embodiment, a donor mask that helps manufacture an organic light-emitting display apparatus that has a reduced occurrence rate of defects and uniform quality, and a method of manufacturing the same may be implemented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an organic light-emitting display apparatus, the method comprising:
   preparing a mother substrate such that the mother substrate includes a plurality of display areas;
   forming a plurality of pixel electrodes on each of the plurality of display areas of the mother substrate;
   preparing a donor mask such that the donor mask includes:
      a base substrate having a plurality of display transferring areas corresponding to the plurality of display areas of the mother substrate, the base substrate including a groove between the plurality of display transferring areas,
      a light-to-heat conversion layer on the base substrate, and
      a reflective layer between the base substrate and the light-to-heat conversion layer, the reflective layer being patterned to include a plurality of through holes in each of the plurality of display transferring areas;
   depositing a transferring layer on the light-to-heat conversion layer of the donor mask;
   aligning the mother substrate and the donor mask; and
   transferring portions of the transferring layer of the donor mask that overlie the plurality of through holes onto the plurality of pixel electrodes on the mother substrate.

2. The method as claimed in claim 1, wherein the transferring layer includes an emissive layer.

3. The method as claimed in claim 1, wherein transferring the portions of the transferring layer includes:
   irradiating flash lamp light or a laser beam onto the base substrate of the donor mask, and
   evaporating, vaporizing, or sublimating at least a portion of the irradiated transferring layer.

4. The method as claimed in claim 1, wherein the light-to-heat conversion layer of the donor mask is not on the groove of the base substrate.

5. The method as claimed in claim 1, wherein:
   the light-to-heat conversion layer of the donor mask is on the plurality of display transferring areas of the base substrate and on the groove, and
   an upper surface of a portion of the light-to-heat conversion layer on the groove is closer to the base substrate than upper surfaces of portions of the light-to-heat conversion layer on the plurality of display transferring areas.

6. The method as claimed in claim 1, wherein the reflective layer of the donor mask is on the plurality of display transferring areas and also on the groove of the base substrate.

7. The method as claimed in claim 1, wherein the donor mask further includes a heat insulating layer between the reflective layer and the light-to-heat conversion layer.

8. The method as claimed in claim 7, wherein the heat insulating layer of the donor mask is not on the groove of the base substrate.

9. The method as claimed in claim 7, wherein:
   the heat insulating layer of the donor mask is on the plurality of display transferring areas of the base substrate and on the groove, and
   an upper surface of a portion of the heat insulating layer on the groove is closer to the base substrate than upper surfaces of portions of the heat insulating layer on the plurality of display transferring areas.

* * * * *